United States Patent
Ishibashi et al.

(10) Patent No.: US 8,044,430 B2
(45) Date of Patent: Oct. 25, 2011

(54) NITRIDE SEMICONDUCTOR LIGHT-EMITTING DEVICE COMPRISING MULTIPLE SEMICONDUCTOR LAYERS HAVING SUBSTANTIALLY UNIFORM N-TYPE DOPANT CONCENTRATION

(75) Inventors: Akihiko Ishibashi, Osaka (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 605 days.

(21) Appl. No.: 12/161,014

(22) PCT Filed: Jan. 17, 2007

(86) PCT No.: PCT/JP2007/050562
§ 371 (c)(1),
(2), (4) Date: Jul. 16, 2008

(87) PCT Pub. No.: WO2007/083647
PCT Pub. Date: Jul. 26, 2007

(65) Prior Publication Data
US 2010/0148145 A1    Jun. 17, 2010

(30) Foreign Application Priority Data
Jan. 18, 2006  (JP) .................................. 2006-009485

(51) Int. Cl.
*H01L 33/00* (2010.01)

(52) U.S. Cl. .............. 257/101; 257/13; 257/79; 257/94; 257/102; 257/103; 257/E33.023; 257/E33.025; 257/E33.028; 257/E33.029; 257/E33.03; 257/E33.033; 257/E33.034

(58) Field of Classification Search ........... 257/E33.025, 257/E33.028, E33.029, E33.03, E33.033, 257/E33.034, 13, 79, 94, 101, 102, 103, E33.023
See application file for complete search history.

(56) References Cited

U.S. PATENT DOCUMENTS

| | | | | |
|---|---|---|---|---|
| 5,679,965 A * | 10/1997 | Schetzina | ...................... | 257/103 |
| 6,100,546 A * | 8/2000 | Major et al. | .................. | 257/103 |
| 6,388,275 B1 * | 5/2002 | Kano | .............................. | 257/94 |
| 6,455,337 B1 * | 9/2002 | Sverdlov | ........................ | 438/22 |
| 6,518,082 B1 | 2/2003 | Kidoguchi et al. | | |
| 7,301,173 B2 * | 11/2007 | Shim et al. | ...................... | 257/79 |
| 7,462,505 B2 * | 12/2008 | Lee et al. | ........................ | 438/47 |

(Continued)

FOREIGN PATENT DOCUMENTS

JP    2785254    1/1995

(Continued)

OTHER PUBLICATIONS

International Search Report for corresponding Application No. PCT/JP2007/050562 dated Apr. 17, 2007.

(Continued)

*Primary Examiner* — Jay C Kim
(74) *Attorney, Agent, or Firm* — Renner, Otto, Boisselle & Sklar, LLP

(57) ABSTRACT

A nitride semiconductor light-emitting device according to the present invention includes a nitride based semiconductor substrate 10 and a nitride based semiconductor multilayer structure that has been formed on the semiconductor substrate 10. The multilayer structure includes an active layer 16 that produces emission and multiple semiconductor layers 12, 14 and 15 that have been stacked one upon the other between the active layer 16 and the substrate 10 and that include an n-type dopant. Each and every one of the semiconductor layers 12, 14 and 15 includes Al atoms.

12 Claims, 6 Drawing Sheets

U.S. PATENT DOCUMENTS

| | | |
|---|---|---|
| 2002/0125491 A1 | 9/2002 | Shibata et al. |
| 2003/0067950 A1 | 4/2003 | Hanaoka |
| 2003/0085409 A1* | 5/2003 | Shen et al. ............ 257/79 |
| 2004/0051107 A1* | 3/2004 | Nagahama et al. ...... 257/79 |
| 2005/0269584 A1* | 12/2005 | Hasegawa et al. ...... 257/94 |

FOREIGN PATENT DOCUMENTS

| | | |
|---|---|---|
| JP | 10-107319 | 4/1998 |
| JP | 10-150245 | 6/1998 |
| JP | 2000-156544 | 6/2000 |
| JP | 2000-340892 | 12/2000 |
| JP | 2002-134822 | 5/2002 |
| JP | 2002-252177 | 9/2002 |
| JP | 2002-252427 | 9/2002 |
| JP | 2002-344088 | 11/2002 |
| JP | 2003-101113 | 4/2003 |
| JP | 2004-087564 | 3/2004 |
| JP | 2005-191306 | 7/2005 |

OTHER PUBLICATIONS

Form PCT/IPEA/408 and a partial English translation.

* cited by examiner 32 n-SIDE ELECTRODE

US 8,044,430 B2

NITRIDE SEMICONDUCTOR LIGHT-EMITTING DEVICE COMPRISING MULTIPLE SEMICONDUCTOR LAYERS HAVING SUBSTANTIALLY UNIFORM N-TYPE DOPANT CONCENTRATION

TECHNICAL FIELD

The present invention relates to a nitride semiconductor light-emitting device.

BACKGROUND ART

A blue-violet semiconductor laser diode, made of Group III-V nitride semiconductors $Al_xGa_yIn_{1-x-y}N$ (where $0 \leq x \leq 1$ and $0 \leq y \leq 1$) such as gallium nitride (GaN), is a key device that would enable optical disc drives to perform a write operation with extremely high densities, and is going to be introduced into actual products in increasing numbers. To develop new industrial fields of applications, it is indispensable to further increase the output power of such a blue-violet semiconductor laser diode because that would contribute to not only getting writing on optical discs done at even higher speeds but also applying it to laser displays.

In the prior art, a sapphire wafer has been used to make nitride semiconductor devices as disclosed in Patent Documents Nos. 1 and 2. When a sapphire wafer is used, an AlGaN based buffer layer, including Al atoms, is sometimes formed on the sapphire wafer to reduce the strain resulting from a lattice misfit with nitride semiconductor crystals or a difference in coefficient of thermal expansion.

On the other hand, if a light-emitting element structure made of nitride semiconductors is formed on a GaN wafer, which has been recently used more and more often in place of the sapphire wafer, a GaN based homo-epitaxially grown layer is usually formed at an initial stage of the crystal growing process.

If a blue-violet light-emitting element is fabricated using nitride semiconductors, however, InN included in InGaN based crystals that form its active layer easily decomposes thermally. That is why a GaN or AlGaN based undercoat layer, including no In atoms, is ordinarily grown at approximately 1,000° C. and then the growth is halted to decrease the temperature to approximately 800° C. And it is known that the surface of that GaN or AlGaN based undercoat layer roughens when the growth is halted abruptly that way.

To overcome such a problem, it was proposed in Patent Document No. 3, for example, that an AlN layer having a higher decomposition temperature than the GaN layer (e.g., an AlGaN undercoat layer including at least 10% of Al atoms, in particular) be formed in advance as a planarity maintaining layer, thereby reducing that surface roughening due to the sudden halt to the growth and growing InGaN based crystals of quality.

Patent Document No. 4 discloses that in growing an n-type cladding layer or an active layer of nitride semiconductors on a wafer, the closer to the active layer a given layer is, the lower the concentration of an n-type dopant to be introduced into that layer should be. By adopting such a configuration, the carriers that have been injected through an electrode can be uniformly diffused more easily, and a light-emitting diode (LED) that produces emission uniformly in a broad area can be fabricated.

Patent Document No. 1: Japanese Patent Application Laid-Open Publication No. 2002-252177
Patent Document No. 2: Japanese Patent Application Laid-Open Publication No. 10-150245
Patent Document No. 3: Japanese Patent Application Laid-Open Publication No. 2000-156544
Patent Document No. 4: Japanese Patent No. 2785254

DISCLOSURE OF INVENTION

Problems to be Solved by the Invention

According to the technique disclosed in Patent Document No. 4, the carriers that have been injected through the electrode can be diffused and introduced uniformly into the active layer but the uniformity of In mole fraction itself in the InGaN based active layer cannot be increased effectively. Once the In mole fraction has become non-uniform in the InGaN based active layer, even if carriers have been injected uniformly, the emission spectrum still broadens. In that case, in a semiconductor laser, some absorption loss inevitably occurs with respect to the laser oscillation wavelength. As a result, the threshold current will increase and the slope efficiency will decrease (which means that the operating current will increase), thus resulting in decreased reliability.

Meanwhile, according to the technique disclosed in Patent Document No. 3, as an AlGaN based planarity maintaining layer including at least 10% of Al atoms is used as an underlying layer for the InGaN based active layer, it seems that the InGaN based active layer will grow with the In mole fraction thereof kept rather uniform. Once the Al mole fraction has become non-uniform in the AlGaN layer that functions as the planarity maintaining layer, however, strain will be produced locally within a plane. As a result, the In mole fraction will have an in-plane distribution in the InGaN based active layer with a large lattice constant, thus also causing an increase in operating current.

In order to overcome the problems described above, the present invention has an object of providing a nitride semiconductor light-emitting device that can operate with a reduced amount of current by flattening the in-plane distribution of a component of the active layer.

Means for Solving the Problems

A nitride semiconductor light-emitting device according to the present invention includes a nitride based semiconductor substrate and a nitride based semiconductor multilayer structure that has been formed on the semiconductor substrate. The multilayer structure includes an active layer that produces emission and multiple semiconductor layers that have been stacked one upon the other between the active layer and the substrate and that include an n-type dopant. Each and every one of the semiconductor layers includes Al atoms.

In one preferred embodiment, a concentration profile of the n-type dopant in the multiple semiconductor layers has no range in which the concentration varies locally perpendicularly to the surface of the substrate.

In another preferred embodiment, the concentration of the n-type dopant in the multiple semiconductor layers is also uniform parallel to the surface of the substrate.

In still another preferred embodiment, a variation in the concentration of the n-type dopant in a layered region, which is defined by a thickness of 5 nm or less as measured from an interface, is 10% or less of an average concentration of the n-type dopant in the multiple semiconductor layers.

In yet another preferred embodiment, in the multilayer structure, the concentration profile of the n-type dopant is substantially uniform between the active layer and the substrate.

In this particular preferred embodiment, the concentration of the n-type dopant in the multiple semiconductor layers falls within the range of $1\times10^{17}$ cm$^{-3}$ to $5\times10^{18}$ cm$^{-3}$.

In yet another preferred embodiment, the concentration profile of the n-type dopant is substantially uniform at each interface between the semiconductor layers.

In a specific preferred embodiment, one of the semiconductor layers that contacts with the substrate includes Al atoms that account for 1 at % or less of its composition.

In another preferred embodiment, the concentration of the Al atoms is substantially uniform within a plane that is defined parallel to the surface of the substrate.

In yet another preferred embodiment, the n-type dopant is Si.

In yet another preferred embodiment, the active layer has an InGaN based multi-quantum well structure.

Another nitride semiconductor light-emitting device according to the present invention includes a nitride based semiconductor substrate and a nitride based semiconductor multilayer structure that has been formed on the semiconductor substrate. The multilayer structure includes an active layer that produces emission, and multiple semiconductor layers that have been stacked one upon the other between the active layer and the substrate and that include an n-type dopant. Each and every one of the semiconductor layers includes Al atoms. One of the semiconductor layers that contacts with the substrate includes Al atoms that account for 1 at % or less of its composition.

A method for fabricating a nitride semiconductor light-emitting device according to the present invention includes the steps of providing a nitride based semiconductor wafer and forming a nitride based semiconductor multilayer structure on the semiconductor wafer. The step of forming the multilayer structure includes stacking multiple semiconductor layers, including an active layer, on the wafer. Each of the semiconductor layers that are located between the active layer and the wafer includes an n-type dopant and Al atoms.

In one preferred embodiment, the step of forming the multilayer structure includes making the concentration profile of the n-type dopant substantially uniform at each interface by adjusting the flow rate of a gas supplied to introduce the n-type dopant.

EFFECTS OF THE INVENTION

According to the present invention, the semiconductor layers that are located between the substrate and the active layer of the semiconductor multilayer structure include Al atoms, and therefore, multiple semiconductor layers can have a substantially uniform concentration profile of an n-type dopant. The present inventors discovered that at an interface between semiconductor layers located under the active layer, the concentration of the n-type dopant often became non-uniform, thus making the emission intensity of the active layer non-uniform within a plane. However, according to the present invention, the composition of the active layer can be sufficiently uniform within the plane, the amount of current to be supplied to trigger laser oscillation can be reduced, and the reliability increases.

Figure 3:
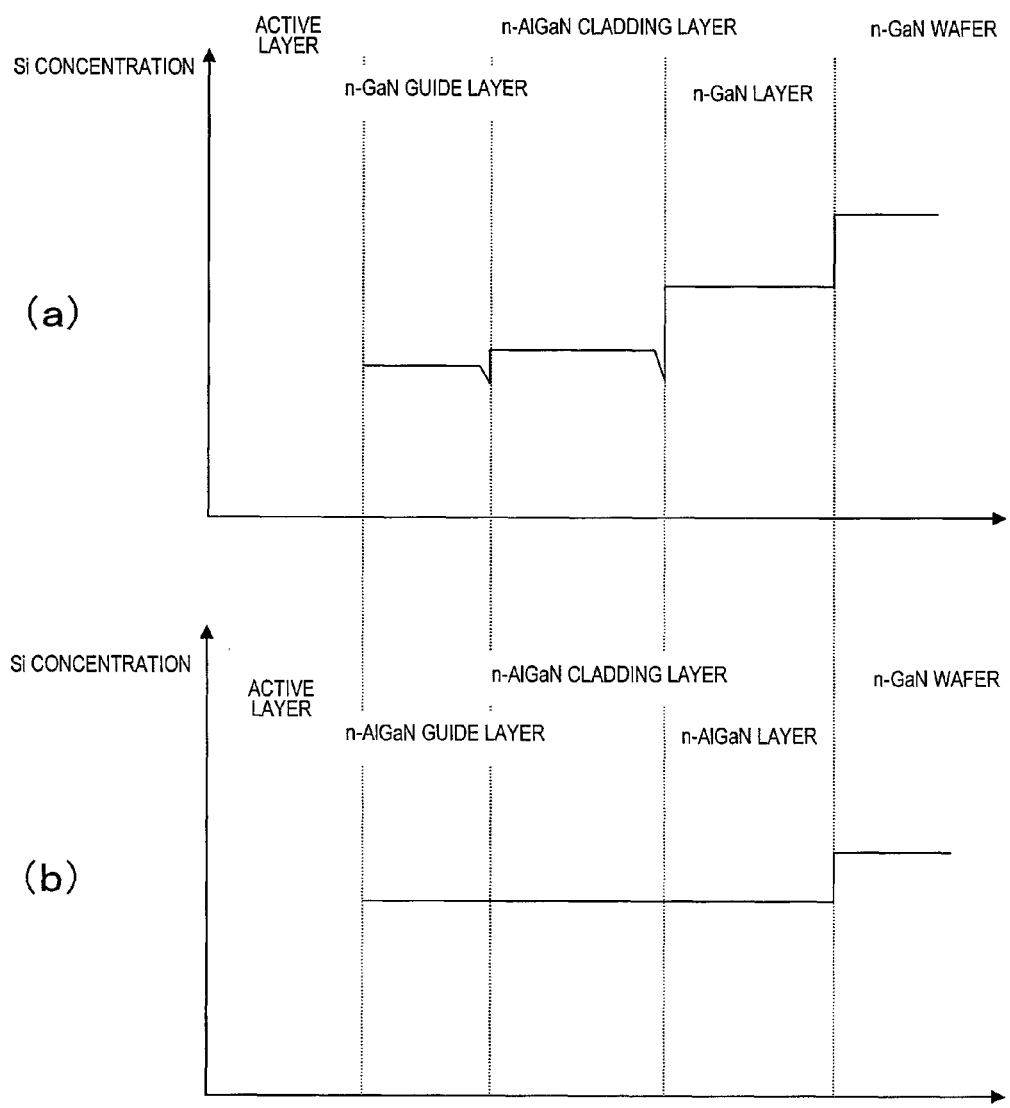

Portion (a) of FIG. 3 shows an Si concentration profile in a conventional device and portion (b) of FIG. 3 shows an Si concentration profile in an example of the present invention.

Figure 4:
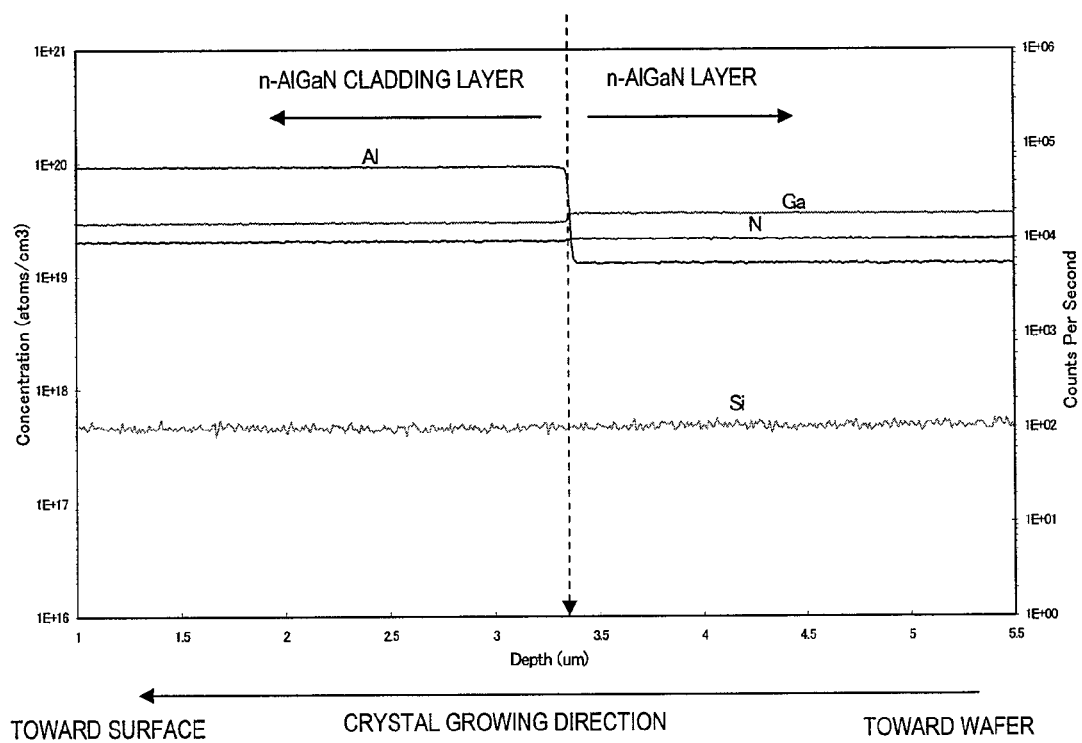

FIG. 4 is a graph showing an Si concentration profile that was measured on a preferred embodiment of the present invention.

Figure 5:
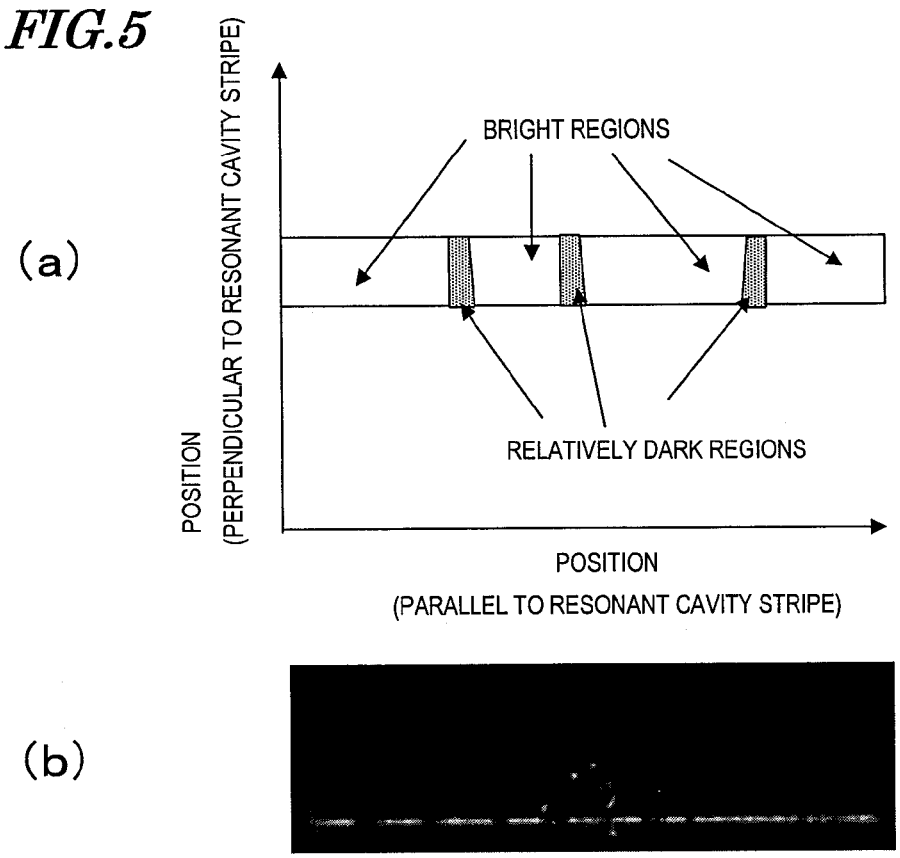

FIG. 5($a$) is a plan view illustrating an emission pattern of a semiconductor laser with the configuration shown in portion (a) of FIG. 3 and FIG. 5($b$) is an EL (electroluminescence) photograph taken by shooting the semiconductor laser from under the back surface of the substrate thereof.

Figure 6:
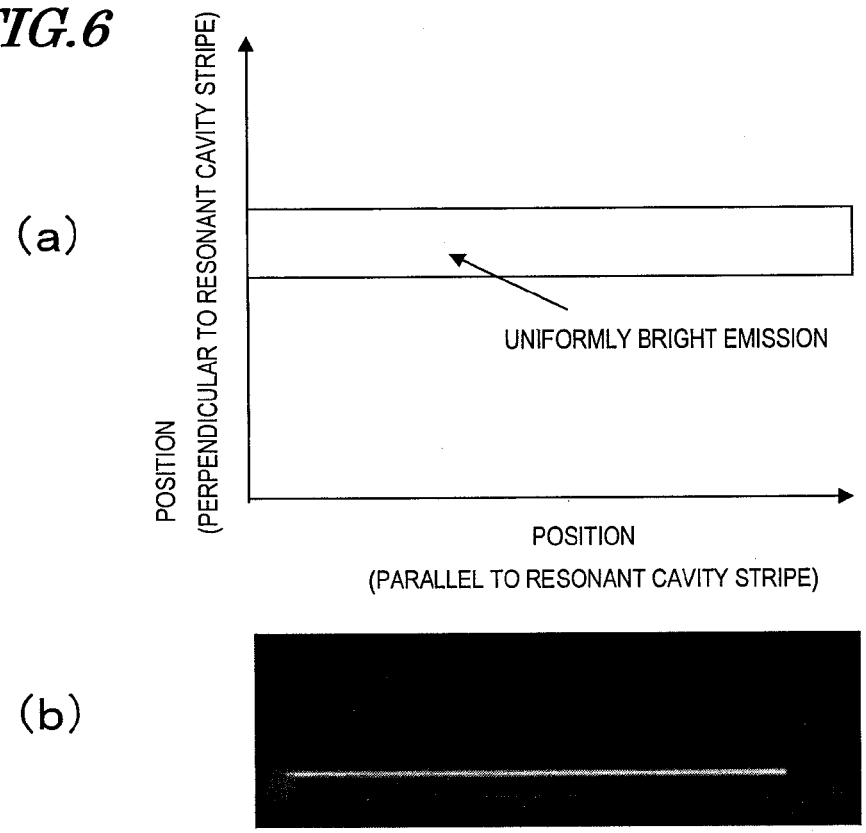

FIG. 6($a$) is a plan view illustrating an emission pattern of a semiconductor laser with the configuration shown in portion (b) of FIG. 3 and FIG. 6($b$) is an EL (electroluminescence) photograph taken by shooting the semiconductor laser from under the back surface of the substrate thereof.

Figure 7:
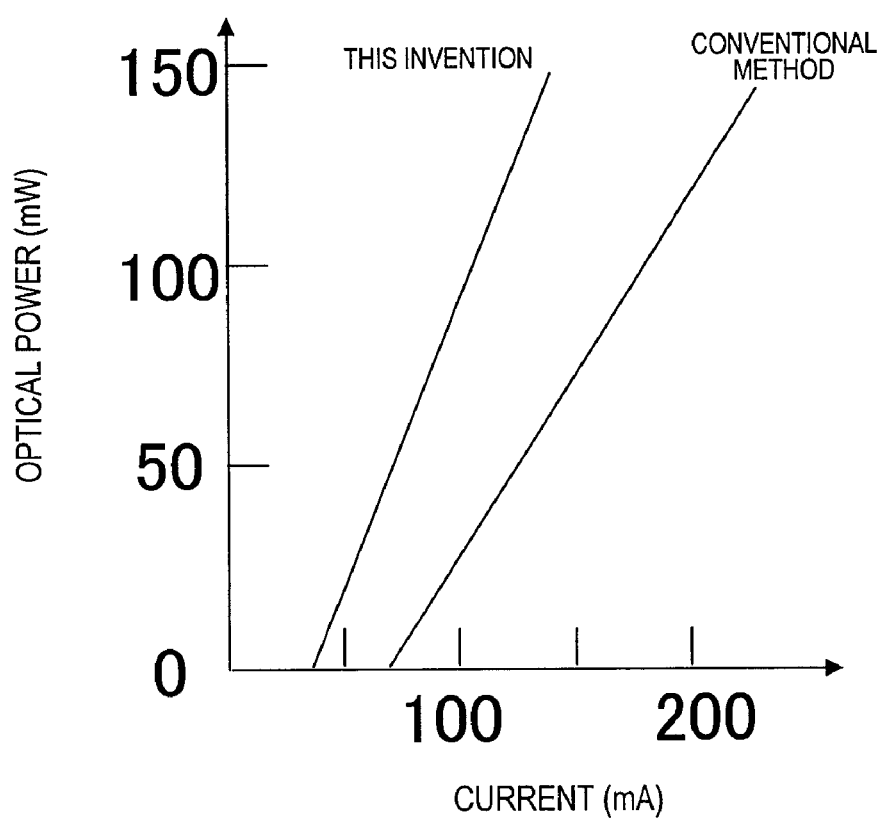

FIG. 7 shows IL curves demonstrating an effect of the present invention.

DESCRIPTION OF REFERENCE NUMERALS

| | |
|---|---|
| 10 | n-type GaN substrate |
| 12 | n-type AlGaN layer |
| 14 | n-type AlGaN cladding layer |
| 15 | n-type AlGaN optical guide layer |
| 16 | InGaN based MQW active layer |
| 17 | InGaN intermediate layer |
| 18 | p-type AlGaN electron overflow suppressing layer |
| 19 | p-type AlGaN cladding layer |
| 20 | p-type GaN contact layer |
| 30 | insulating film |
| 31 | p-side contact electrode (Pd/Pt) |
| 32 | n-side contact electrode (Ti/Pt/Au) |
| 33 | p-side interconnect electrode (Ti/Pt/Au) |
| 40 | solder |
| 41 | interconnect electrode |
| 42 | Au wire |
| 43 | sub-mount |

BEST MODE FOR CARRYING OUT THE INVENTION

The present inventors discovered that the In mole fraction in the InGaN active layer became non-uniform due to an improper method of forming an underlying layer, on which a crystal growing process should be performed on a semiconductor wafer, thus obtaining the basic idea of the present invention.

According to the present invention, the semiconductor layers that are located between the substrate and the active layer of the semiconductor multilayer structure include Al atoms. Thus, by adjusting the flow rate of a gas supplied as an n-type dopant in forming the semiconductor multilayer structure on the surface of a nitride semiconductor wafer (i.e., on the Ga plane), a number of semiconductor layers can have a substantially uniform concentration profile of the n-type dopant at each interface thereof. It will be described in further detail later why the concentration profile of the n-type dopant can be made uniform.

In making a light-emitting element such as a semiconductor laser diode, the semiconductor multilayer structure will have a double heterostructure and a structure to confine light and current in a certain space.

In the prior art, nobody has ever embraced the idea of producing a uniform concentration profile of an n-type dopant in the semiconductor layers to be located under an active layer (i.e., semiconductor layers located between the active layer and the substrate). For example, according to the conventional technique disclosed in Patent Document No. 4, the concentrations of n-type carriers in those underlying layers are adjusted such that the closer to the active layer, the lower the concentration. As the donor level is shallow, almost all of the n-type dopant is activated at room temperature, thus releasing carriers (electrons). For that reason, the concentration of the n-type carriers may be regarded as equal to the concentration of the n-type dopant.

It should be noted that the concentration of the n-type dopant and all of the other concentrations were measured herein by secondary ion mass spectrometry (SIMS).

Hereinafter, it will be described with reference to portion (a) of FIG. 3 what problems will arise if the semiconductor layers are doped with Si, which is a typical n-type dopant, so as to have such a concentration profile.

In the example shown in portion (a) of FIG. 3, an n-type GaN layer, an n-type AlGaN cladding layer, and an n-type GaN guide layer are supposed to be stacked in this order on an n-type GaN wafer and the Si concentrations of these semiconductor layers are decreased in this order. In that case, not only the types of the semiconductor layers but also the doping levels need to be changed at the interface between the n-type GaN layer and the n-type AlGaN cladding layer and at the interface between the n-type AlGaN cladding layer and the n-type AlGaN guide layer.

To change the types of semiconductor layers to grow, the source gases and growth temperatures need to be changed in the epitaxial growth process. For example, the growth temperature of the n-type AlGaN cladding layer should be higher than that of the n-type GaN layer by 20-30° C. That is why even if the n-type AlGaN cladding layer needs to be grown on the n-type GaN layer, the growth of the n-type AlGaN cladding layer cannot be started until the temperature is raised to the required level in a few minutes. If the temperature is raised, however, the wafer might have non-uniform surface temperatures or the surface state of the n-type GaN layer could change locally, too. That is why the concentration of Si would become non-uniform at the interface between the n-type GaN layer and the n-type AlGaN cladding layer. A similar phenomenon could also happen when the n-type GaN guide layer is grown on the n-type AlGaN cladding layer. In that case, however, before the n-type GaN guide layer starts to be grown, the temperature should be lowered, not raised.

In the example shown in portion (a) of FIG. 3, the concentration of S decreases locally at the interface between the n-type GaN layer and the n-type AlGaN cladding layer and at the interface between the n-type AlGaN cladding layer and the n-type AlGaN guide layer. However, the Si concentration is not always lower at each interface than in its associated semiconductor layer but could rather increase in some places.

As described above, if the Si concentration is measured in the thickness direction of the semiconductor layers (i.e., perpendicularly to the surface of the wafer), a variation in Si concentration is observed at each interface between those semiconductor layers. However, the present inventors discovered that the Si concentration also varied even within a plane parallel to the wafer surface. In a situation where the Si concentration has such an in-plane distribution in those semiconductor layers to be underlying layers of the epitaxial growth, if a semiconductor layer including Al (such as an AlGaN layer) needs to be grown thereon, then Al atoms will have a distribution corresponding to the concentration distribution of the Si atoms, and therefore, the Al concentration in the AlGaN layer will also have an in-plane distribution. Once the Al concentration has become non-uniform within a plane, strain will be produced locally in the AlGaN layer due to the Al concentration distribution.

The present inventors measured the Si concentrations by the SIMS. As a result, we discovered that the Si concentration varied significantly at the interface between multiple semiconductor layers with mutually different Si concentration settings and also confirmed that the Si concentration continued to vary vertically even far away from the interface. When the Si concentration was decreased, the magnitude of that variation was so great that it would take a while for the Si concentration that had varied significantly at the interface to get settled and reach its target value. A similar phenomenon would happen even with an n-type dopant other than Si. For that reason, the n-type dopant concentration settings should not be changed between multiple semiconductor layers but the concentration profile in the thickness direction is preferably defined to be as uniform as possible. The present inventors also discovered that if the strain that had been produced in the AlGaN layer reached the underlying layers, then the In atom concentration had an in-plane distribution in the InGaN based multi-quantum well (MQW) that was grown on those underlying layers. If an active layer in which the In atom concentration has an in-plane distribution is used, then the emission intensity will no longer be uniform on a laser stripe plane as shown in FIGS. 5(a) and 5(b). As a result, the brightness varies from one position to another to make luminous spots. FIG. 5(b) is an electroluminescence (EL) photograph that was taken by shooting a semiconductor laser, in which the strain in the AlGaN layer reached the underlying layers, from under the back surface of its substrate and FIG. 5(a) is a schematic representation corresponding to the EL photograph.

The fact that luminous spots will be produced in an InGaN based MQW has been known for itself but nobody knows why. Light radiated from a relatively bright part will have a longer wavelength than light radiated from a relatively dark part, and a portion of the active layer included in that bright part will have a relatively high In concentration. The present inventors discovered that such luminous spots had been produced due to a non-uniform Si atom concentration in those semiconductor layers under the active layer.

The bandgap and luminous efficacy will change locally according to the In atom concentration. Then, the brightness of the emission, which is a particularly important factor, will also vary from one position to another, thus making luminous spots and causing an increase in operating current while the laser is being driven, which is a problem. The present inventors discovered that the luminous spots were produced in the InGaN based MQW due to that local distribution of Si atoms mentioned above.

In a preferred example of the present invention, the doping process is carried out such that the n-type carrier concentration (e.g., Si concentration in this example) becomes constant from the underlying layer right on the wafer through the active layer as shown in portion (b) of FIG. 3. More specifically, if an n-type AlGaN layer, an n-type AlGaN cladding layer, and an n-type AlGaN guide layer are stacked in this order on an n-type GaN wafer, the flow rate of $SiH_4$ gas is controlled such that each of these layers has a constant Si concentration. The magnitude of variation in $SiH_4$ flow rate is preferably reduced to 10% or less of the average flow rate.

FIG. 4 is a graph showing an Si concentration profile that was measured on a preferred embodiment of the present invention to be described later. As can be seen from the graph shown in FIG. 4, the Si concentration was uniform in the n-type AlGaN cladding layer and the n-type AlGaN layer.

It should be noted that at the interface between the GaN wafer and the n-type AlGaN layer, an n-type dopant such as Si would pile up easily due to a contamination on the surface of the wafer. Even at the interface between the GaN wafer and the n-type AlGaN layer, the concentration of the n-type dopant is preferably constant. However, it is difficult to equalize the n-type dopant concentration at that interface with the one elsewhere. Thus, in a preferred embodiment of the present invention, the n-type dopant concentration profile is substantially constant between the active layer and the substrate of the semiconductor multilayer structure but the n-type dopant concentration may pile up at the interface between the substrate and the semiconductor multilayer structure.

At the interface between the n-type AlGaN layer and the n-type AlGaN cladding layer and at the interface between the n-type AlGaN cladding layer and the n-type AlGaN guide layer, the Al mole fraction varies but the growth temperature itself does not change and the local variation in Si concentration is reduced at those interfaces.

It should be noted that to change the Al mole fractions, the mixture ratio of the source gases to be supplied into the reaction furnace should be adjusted. In that case, if the flow rate of a gas such as $SiH_4$ gas to be supplied as a doping gas into the reaction furnace is also adjusted, then the Si concentration in the semiconductor layers can be controlled toward a constant value. This is because even if the doping gas is supplied at the same rate but if the Al mole fraction changes, the concentration of the dopant introduced into a growing layer could change. Meanwhile, by not only adjusting the flow rate of the $SiH_4$ gas but also varying the growth rate of the semiconductor layers, the Si concentration can also be controlled toward a constant value. More specifically, the vapor phase ratio may be adjusted and varied such that the combined flow rate of trimethylgallium (TMG) and trimethylaluminum (TMA) gases, which are Group III source gases, has a desired Al solid phase ratio.

As shown in FIG. 3(a), if a semiconductor layer including no Al (such as an n-type GaN layer) has been grown right on the n-type GaN wafer, then the Si and Al atom concentrations are likely to have non-uniform in-plane distributions while an n-type AlGaN cladding layer with a relatively high Al concentration (with an Al mole fraction of approximately 2-6%) is being grown. That is why in the example shown in portion (b) of FIG. 3, Al is preferably added from the initial stage of the epitaxial growth process on the surface of the n-type GaN wafer even if the dose is very small.

In the example shown in portion (a) of FIG. 3, since the underlying semiconductor layer deposited on the n-type GaN wafer has no in-plane distribution of Si concentrations, the Al-containing semiconductor layer grown on that underlying semiconductor layer (such as an AlGaN layer) has no in-plane distribution of Al concentrations, either. As a result, an InGaN based MQW with an In mole fraction that is uniform within the plane can be obtained. If such an active layer is used, then emission with uniform brightness can be produced within a plane of the laser stripe as shown in FIGS. 6(a) and 6(b). FIG. 6(a) is an EL photograph taken by shooting a semiconductor laser, in which the strain in the AlGaN layer did not reach the underlying layers, from under the back surface thereof, and FIG. 6(b) is a schematic representation corresponding to that EL photograph.

The semiconductor laser diodes having the configurations shown in portions (a) and (b) of FIG. 3, respectively, have the characteristics shown in FIG. 7. By adopting the configuration shown in portion (a) of FIG. 3, a lower threshold current and a higher slope efficiency (i.e., lower operating current) are realized compared to conventional ones. If the drive current can be reduced, then the power dissipation can also be reduced and the reliability can be increased. Also, if the degree of uniformity of brightness can be increased within the plane of the active layer, then the variation in emission intensity between the respective elements can be reduced and the production yield can be increased.

Embodiments

Hereinafter, a preferred embodiment of a nitride semiconductor device according to the present invention will be described with reference to the accompanying drawings.

Figure 1:
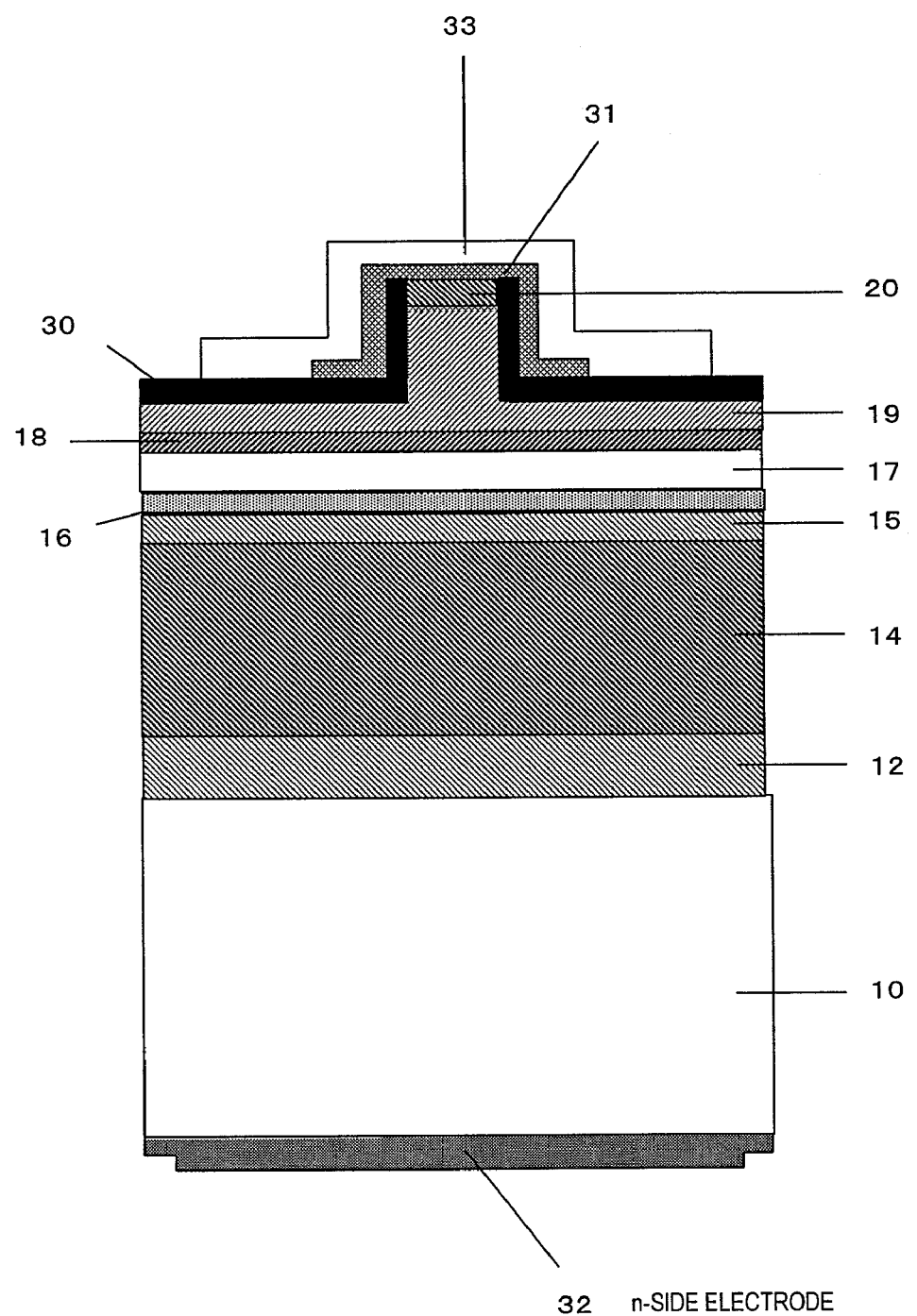
FIG. 1 is a cross-sectional view of an element as a preferred embodiment of the present invention.

First, referring to FIG. 1, illustrated schematically is a cross section of a nitride semiconductor device as a preferred embodiment of the present invention, which is implemented as a GaN based semiconductor laser diode in this example. The cross section of the device shown in FIG. 1 is viewed on a plane that is parallel to one end facet of the resonant cavity. That is to say, the resonant cavity length direction is perpendicular to this cross section.

The semiconductor laser diode of this preferred embodiment includes an n-type GaN substrate 10 with a thickness of about 100 μm, which is doped with an n-type dopant, and a semiconductor multilayer structure that has been formed on the top surface (i.e., the Ga plane) of the n-type GaN substrate 10.

The semiconductor multilayer structure includes an n-type AlGaN layer 12, an n-type AlGaN cladding layer 14, an n-type AlGaN optical guide layer 15, an InGaN based MQW active layer 16, an InGaN intermediate layer 17, a p-type AlGaN electron overflow suppressing layer 18, a p-type AlGaN cladding layer 19 and a p-type GaN contact layer 20.

These semiconductor layers included in the semiconductor multilayer structure of this preferred embodiment may have the dopant concentrations and thicknesses shown in the following Table 1:

TABLE 1

| Semiconductor layer | Dopant concentration (cm$^{-3}$) | Thickness |
|---|---|---|
| n-AlGaN layer 12 | Si: $5 \times 10^{17}$ | 1 μm |
| n-AlGaN cladding layer 14 | Si: $5 \times 10^{17}$ | 1.5 μm |
| n-AlGaN optical guide layer 15 | Si: $5 \times 10^{17}$ | 150 nm |
| InGaN multi-quantum well layer 16 | | 3 nm (active layer)/ 8 nm (barrier layer) |
| InGaN intermediate layer 17 | | 60 nm |
| p-AlGaN overflow suppressing layer 18 | Mg: $1 \times 10^{19}$ | 20 nm |
| p-AlGaN cladding layer 19 | Mg: $1 \times 10^{19}$ | 0.5 μm |
| p-GaN contact layer 20 | Mg: $1 \times 10^{20}$ | 0.1 μm |

This preferred embodiment is characterized in that the semiconductor layers located between the InGaN based MQW active layer 16 and the n-type GaN substrate 10, namely, the n-type AlGaN layer 12, the n-type AlGaN cladding layer 14 and the n-type AlGaN optical guide layer 15, include an n-type dopant (Si) at the same concentration and that all of these semiconductor layers 12, 14 and 15 include Al.

According to this preferred embodiment, the Si concentrations are distributed substantially uniformly both perpendicular and parallel to the surface of the substrate 10 as already described with reference to portion (b) of FIG. 3, thus overcoming the problems with the conventional semiconductor laser diodes. A method of doping those semiconductor layers with Si uniformly in such a manner will be described later.

It is only natural that the Si concentration easily varies locally at each interface between semiconductor layers that are located between the InGaN based MQW active layer 16 and the n-type GaN substrate 10. The Si concentration distribution easily becomes non-uniform not just perpendicularly to the surface of the substrate 10 but also parallel to the surface. As described above, the non-uniformity of Si concentration at an interface will make the In concentration non-uniform in the semiconductor layer to be grown thereon. According to this preferred embodiment, however, as the Si concentration is uniform, so is the In concentration.

The uniformity of the Si concentration (i.e., an n-type dopant concentration) can be estimated by the magnitude of variation in Si concentration (i.e., n-type dopant concentration) in a layered region, which is defined by a thickness of 5 nm or less as measured from the interface between the semiconductor layers. If this magnitude of variation is 10% or less of the average concentration of Si (an n-type dopant) in the semiconductor layers, then the Si concentration (i.e., n-type dopant concentration) can be regarded as substantially uniform at the interface.

It should be noted that the dopants, the dopant concentrations and the thicknesses of the respective semiconductor layers shown in this Table 1 are just examples and are never intended to limit the scope of the present invention. The concentration of the n-type dopant preferably falls within the range of $1 \times 10^{17}$ cm$^{-3}$ to $5 \times 10^{18}$ cm$^{-3}$.

In the semiconductor multilayer structure of this preferred embodiment, the p-type GaN contact layer 20 and the p-type AlGaN cladding layer 19 have been patterned into a ridge stripe shape so as to run in the resonant cavity length direction. The ridge stripe may have a width of about 1.5 µm and the resonant cavity may have a length of 600 µm, for example. The chip width (i.e., a size of the element as measured parallel to the respective semiconductor layers shown in FIG. 1) may be 200 µm, for example.

The upper surface of the semiconductor multilayer structure is entirely covered with an insulating film 30 (which is an SiO$_2$ layer in this preferred embodiment) except the upper surface of the ridge stripe. And a striped opening has been cut through the center portion of the insulating film so as to expose the upper surface of the ridge stripe. Through that opening of the insulating film 30, the surface of the p-type GaN contact layer 20 makes contact with the p-side contact electrode (Pd/Pt) 31. And a p-side interconnect electrode (Ti/Pt/Au) 33 is arranged so as to cover the entire upper surface of the p-side contact electrode 31. It should be noted that the back surface of the n-type GaN substrate 10 contacts with an n-side electrode (Ti/Pt/Au) 32.

Hereinafter, a preferred embodiment of a method for fabricating the nitride semiconductor device of this preferred embodiment will be described.

First, an n-type GaN wafer 10 that has been made by a conventional process is provided. The n-type GaN wafer 10 may have a thickness of approximately 400 µm, for example, at an initial stage of the epitaxial growth process. The top surface of the n-type GaN wafer 10 has been planarized by a polishing process.

Next, a semiconductor multilayer structure is formed on the top surface of the n-type GaN wafer 10. The semiconductor multilayer structure may be formed by a known epitaxial growth technique. The respective semiconductor layers may be grown in the following manner, for example.

First, the n-type GaN wafer 10 is loaded into the reaction furnace (i.e., chamber) of a metalorganic vapor phase epitaxy (MOVPE) system. After that, the surface of the n-type GaN wafer 10 is subjected to a heat treatment (i.e., thermal cleaning) at a temperature of approximately 500 to 1,100° C. This heat treatment may be carried out at 800° C. for at least one minute, preferably five minutes or more. While this heat treatment is being conducted, a gas including nitrogen (N) atoms (such as N$_2$, NH$_3$ or hydrazine gas) is preferably supplied into the chamber.

Thereafter, with the temperature of the reaction furnace controlled at about 1,000° C., trimethylgallium (TMG), trimethylaluminum (TMA) and ammonia (NH$_3$) as source gases and hydrogen and nitrogen as carrier gases are supplied simultaneously and silane (SiH$_4$) gas is also supplied as an n-type dopant, thereby growing an n-type Al$_{0.002}$Ga$_{0.998}$N layer 12 with an Si concentration of about $5 \times 10^{17}$ cm$^{-3}$ to a thickness of approximately 1 µm.

Next, with the flow rate of the trimethylaluminum (TMA) gas increased, an n-type AlGaN cladding layer 14, made of Al$_{0.04}$Ga$_{0.96}$N with an Si concentration of about $5 \times 10^{17}$ cm$^3$, is grown to a thickness of approximately 1.5 µm. Subsequently, an n-type AlGaN optical guide layer 15 made of n-type Al$_{0.005}$Ga$_{0.995}$N with an Si concentration of about $5 \times 10^{17}$ cm$^{-3}$ is grown to a thickness of approximately 150 nm. After that, the temperature is lowered to around 800° C., the carrier gases are changed from hydrogen into nitrogen, and trimethylindium (TMI) and TMG are supplied, thereby alternately growing three quantum well layers of In$_{0.1}$Ga$_{0.9}$N to a thickness of approximately 3 nm each and two In$_{0.02}$Ga$_{0.98}$N barrier layers to a thickness of approximately 8 nm each to make an MQW active layer 16. Thereafter, an InGaN intermediate layer 17 of In$_{0.01}$Ga$_{0.99}$N is grown. The InGaN intermediate layer 17 can significantly reduce the diffusion of a p-type dopant (e.g., Mg in this example) from the p-type semiconductor layers to be grown thereon to the active layer 16 and can also suppress the thermal decomposition of the active layer 16, thus maintaining the high quality of the active layer 16.

Next, the temperature in the reaction furnace is raised to around 1,000 (AD again, hydrogen is also supplied as an additional carrier gas, and biscyclopentadienyl magnesium (Cp$_2$Mg) gas is supplied as a p-type dopant gas, thereby growing a p-type AlGaN overflow suppressing layer 18 made of Al$_{0.20}$Ga$_{0.80}$N with an Mg concentration of approximately $1 \times 10^{19}$ cm$^{-3}$ to a thickness of approximately 20 nm.

Subsequently, a p-type AlGaN cladding layer 19 made of Al$_{0.05}$Ga$_{0.95}$N with a dopant concentration of approximately $1 \times 10^{19}$ cm$^{-3}$ is grown to a thickness of approximately 0.5 µm. Finally, a p-type contact layer 20 with an Mg concentration of approximately $1 \times 10^{20}$ cm$^3$ is grown to a thickness of approximately 0.1 µm.

Next, an insulating film is deposited over the upper surface of the semiconductor multilayer structure with a plasma CVD system, for example. This insulating film is preferably made of a material such as SiO$_2$ that has a high degree of dry etch resistance so as to make a dry etch mask. Thereafter, the insulating film is patterned into a stripe shape with a width of 1.5 µm by performing a photolithographic process and a hydrofluoric acid treatment in combination. Subsequently, using the striped insulating film as a dry etch mask, the p-type semiconductor layers are patterned into a ridge shape with a dry etching system and then the remaining portion of the ridge-like insulating film is removed by a hydrofluoric acid treatment. Next, an insulating film 30 of SiO$_2$ is deposited over the upper surface of the semiconductor multilayer structure with the ridge, and then only a portion of the insulating film that is located on the ridge is removed by performing a photolithographic process and a hydrofluoric acid treatment in combination. After that, Pd and Pt are deposited by an evaporation process in this order by performing a photolithographic process and a photoresist lift-off process such that a p-side contact electrode (Pd/Pt) 31 runs parallel to the ridge and covers the upper, side and bottom surfaces of the ridge. Subsequently, Ti, Pt and Au that form a p-side interconnect electrode (Ti/Pt/Au) 33 are deposited in this order by an evaporation process so as to cover the surfaces of the p-side contact electrode 31.

Next, the back surface of the n-type GaN wafer 10 is polished to reduce the thickness of the n-type GaN wafer 10 to approximately 100 μm. Subsequently, the polished surface is cleaned by wet and dry etching processes, for example, and respective metal layers of Ti, Pt and Au are deposited continuously in this order on the wafer, thereby forming an n-side electrode 32. Thereafter, the wafer is divided into bars by a primary cleavage process, the end facets of the resonant cavity is coated with an insulating film to adjust the reflectance thereof, and then the bars are further divided and processed into respective semiconductor laser chips by a secondary cleavage process.

Figure 2:
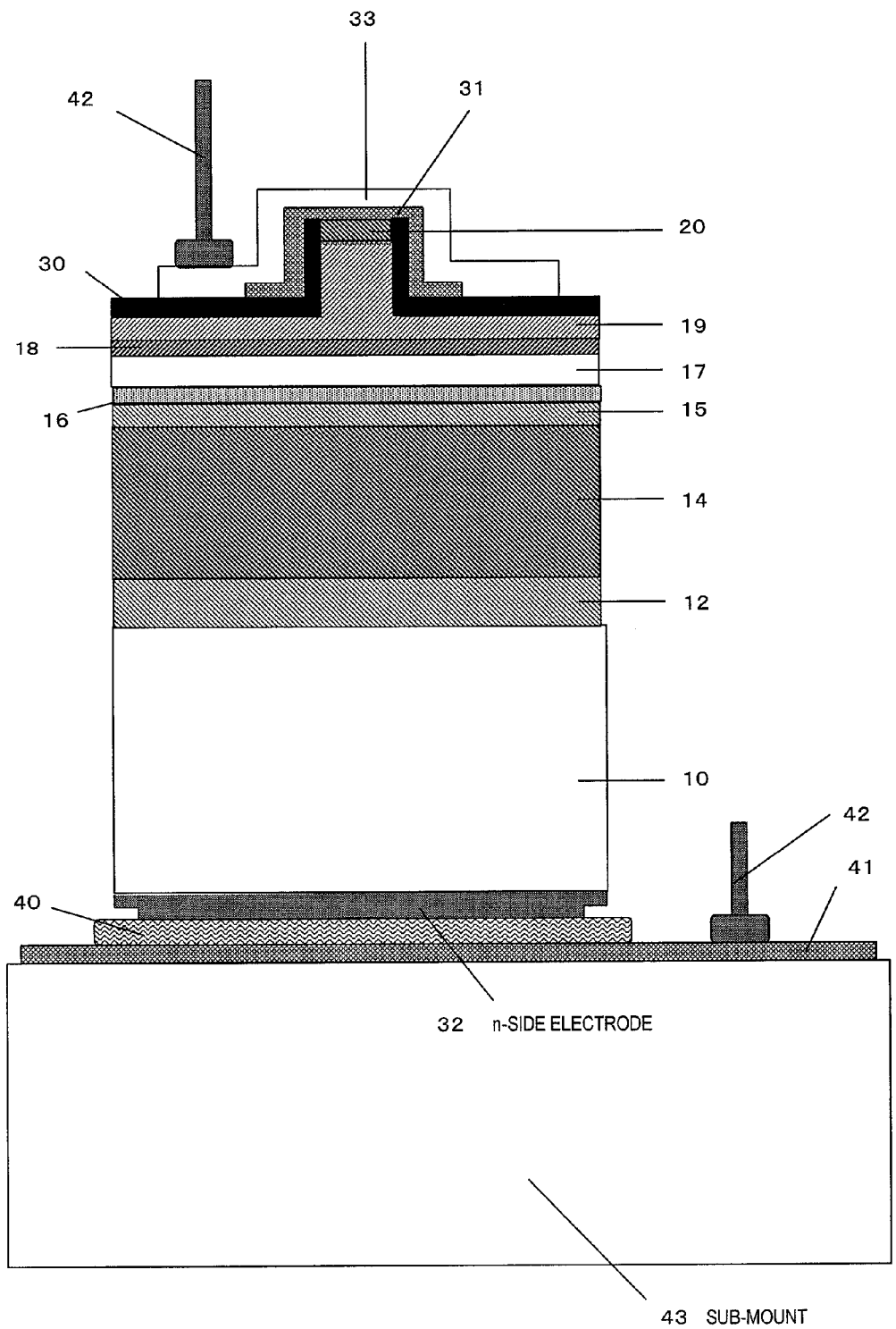
FIG. 2 is a cross-sectional view of a mounted element as a preferred embodiment of the present invention.

Next, the mounting process step will be described with reference to FIG. 2.

Each of the laser chips obtained by dividing the wafer is automatically mounted on a sub-mount 43 of AlN and stem with solder 40. Next, an Au wire 42 for supplying current is connected to the p-side interconnect electrode 33 and the interconnect electrode 41 of the sub-mount that is electrically connected to the n-side electrode 32, thereby performing an UP mounting process such that the semiconductor multilayer structure faces up. In this case, the Au wire 42 connected onto the p-side interconnect electrode 33 and the p-side contact electrode exposed portion are preferably arranged on two opposite sides of the ridge. This arrangement is preferred because if the impact of the wire bonding process to connect the Au wire 42 were conveyed to the p-side contact electrode exposed portion, then the p-side contact electrode 31 could come off. Finally, to shield the laser chip from the external air, a cap with a laser beam passing glass window is welded with a high electric field press machine.

The laser fabricated by the process of this preferred embodiment was energized at room temperature. As a result, the laser achieved continuous wave oscillation at a threshold current of 30 mA and had a slope efficiency of 1.5 W/A and an oscillation wavelength of 405 nm. Also, since the p- and n-side electrodes reached even the end facets of the laser diode, the quantity of heat dissipated from around the end facets did not decrease so much, and therefore, the laser could operate even at as high a temperature as 80° C. and with as high a power as 150 mW. When the laser was subjected to a life test, it was confirmed that the MTTF was 5,000 hours under an operating environment of 70° C. and 150 mW.

In the preferred embodiment described above, the n-type AlGaN layer 12 is supposed to have an Al mole fraction of 0.2%. However, the underlying semiconductor layer to be deposited on the surface of the wafer preferably has an Al mole fraction falling within the range of 0.1% to 1.0%. It should be noted that the Al mole fraction does not have to be constant perpendicularly to the surface of the wafer.

The effect of producing a uniform in-plane distribution of a component of the active layer can be achieved more easily if all of the semiconductor layers with an n-type dopant between the active layer and the wafer include Al atoms. In that case, the semiconductor layer in contact with the wafer does not have to have a high Al atom concentration, which is preferably 1 at % or less of the overall composition. If this Al mole fraction were too high, then strain would be produced at the interface with the wafer and the Al mole fraction would easily become non-uniform.

As the n-type dopant, Ge or O may also be used instead of Si.

INDUSTRIAL APPLICABILITY

The present invention can be used effectively in nitride semiconductor devices such as semiconductor laser diodes that are expected to be light sources for high-density optical discs. The present invention can reduce a fluctuation in In mole fraction in an InGaN based active layer, thus contributing to mass-producing highly reliable nitride semiconductor devices with an increased yield and at a reduced cost.

The invention claimed is:

1. A nitride semiconductor light-emitting device comprising
    a nitride based semiconductor substrate, and
    a nitride based semiconductor multilayer structure that has been formed on the nitride based semiconductor substrate,
    wherein the nitride based semiconductor multilayer structure includes
    an active layer that produces emission, and
    multiple semiconductor layers that have been stacked one upon the other between the active layer and the nitride based semiconductor substrate and that include an n-type dopant,
    wherein each and every one of the multiple semiconductor layers includes Al atoms and a variation in a concentration of the n-type dopant in a layered region, which is defined by a thickness of 5 nm or less as measured from each interface between the multiple semiconductor layers, is 10% or less of an average concentration of the n-type dopant in the multiple semiconductor layers.

2. The nitride semiconductor light-emitting device of claim 1, wherein a concentration of the n-type dopant in the multiple semiconductor layers is uniform parallel to a surface of the nitride based semiconductor substrate.

3. The nitride semiconductor light-emitting device of claim 1, wherein in the nitride based semiconductor multilayer structure, a concentration profile of the n-type dopant is substantially uniform between the active layer and the nitride based semiconductor substrate.

4. The nitride semiconductor light-emitting device of claim 3, wherein the concentration of the n-type dopant in the multiple semiconductor layers falls within a range of $1 \times 10^{17}$ $cm^{-3}$ to $5 \times 10^{18}$ $cm^{-3}$.

5. The nitride semiconductor light-emitting device of claim 1, wherein a concentration profile of the n-type dopant is substantially uniform at the each interface between the multiple semiconductor layers.

6. The nitride semiconductor light-emitting device of claim 5, wherein one of the multiple semiconductor layers that contacts the nitride based semiconductor substrate includes Al atoms that account for 1 at % or less of its composition.

7. The nitride semiconductor light-emitting device of claim 5, wherein a concentration of the Al atoms is substantially uniform within a plane that is defined parallel to a surface of the nitride based semiconductor substrate.

8. The nitride semiconductor light-emitting device of claim 1, wherein the n-type dopant is Si.

9. The nitride semiconductor light-emitting device of claim 1, wherein the active layer has an InGaN based multi-quantum well structure.

10. A nitride semiconductor light-emitting device comprising
- a nitride based semiconductor substrate, and
- a nitride based semiconductor multilayer structure that has been formed on the nitride based semiconductor substrate,
- wherein the nitride based semiconductor multilayer structure includes
- an active layer that produces emission, and
- multiple semiconductor layers that have been stacked one upon the other between the active layer and the nitride based semiconductor substrate and that include an n-type dopant,
- wherein each and every one of the multiple semiconductor layers includes Al atoms and a variation in a concentration of the n-type dopant in a layered region, which is defined by a thickness of 5 nm or less as measured from each interface between the multiple semiconductor layers, is 10% or less of an average concentration of the n-type dopant in the multiple semiconductor layers, and
- wherein one of the multiple semiconductor layers that contacts the nitride based semiconductor substrate includes Al atoms that account for 1 at % or less of its composition.

11. A method for fabricating a nitride semiconductor light-emitting device, the method comprising the steps of providing a nitride based semiconductor wafer and forming a nitride based semiconductor multilayer structure on the nitride based semiconductor wafer,
- wherein the step of forming the nitride based semiconductor multilayer structure includes stacking multiple semiconductor layers, including an active layer, on the nitride based semiconductor wafer, and
- wherein each of the multiple semiconductor layers that are located between the active layer and the nitride based semiconductor wafer includes an n-type dopant and Al atoms, and
- wherein a variation in a concentration of the n-type dopant in a layered region, which is defined by a thickness of 5 nm or less as measured from each interface between the multiple semiconductor layers, is 10% or less of an average concentration of the n-type dopant in the multiple semiconductor layers.

12. The method of claim 11, wherein the step of forming the nitride based semiconductor multilayer structure includes making a concentration profile of the n-type dopant substantially uniform at the each interface by adjusting a flow rate of a gas supplied to introduce the n-type dopant.

* * * * *